(12) United States Patent
Kusunoki

(10) Patent No.: US 7,330,518 B2
(45) Date of Patent: Feb. 12, 2008

(54) DISTORTION COMPENSATION CIRCUIT, AND A TRANSMISSION APPARATUS INCLUDING THE SAME

(75) Inventor: Shigeo Kusunoki, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 700 days.

(21) Appl. No.: 10/825,914

(22) Filed: Apr. 16, 2004

(65) Prior Publication Data

US 2004/0210789 A1 Oct. 21, 2004

(30) Foreign Application Priority Data

Apr. 18, 2003 (JP) .......................... P2003-113887

(51) Int. Cl.
*H04K 1/02* (2006.01)

(52) U.S. Cl. ...................... 375/297; 375/278; 375/284; 375/285; 375/296; 381/13; 398/193; 455/114.3; 702/190

(58) Field of Classification Search ................ 375/296, 375/297; 398/193; 455/114.3; 702/190
See application file for complete search history.

(56) References Cited

U.S. PATENT DOCUMENTS 5,579,247 A * 11/1996 Kerth et al. ................. 702/190
6,512,417 B2   1/2003 Booth et al.

2002/0021173 A1   2/2002 Yamamoto et al.
2002/0061074 A1   5/2002 Kusunoki
2002/0181611 A1 * 12/2002 Kim .......................... 375/296

FOREIGN PATENT DOCUMENTS

EP          1 280 272          1/2003

OTHER PUBLICATIONS

DAndrea et al; RF power amplifier linearization through amplitude and phase predistortion; Nov. 1996; IEEE Transactions on Communications; vol. 44; pp. 1477-1484.*

Tsimbinos; The computational complexity of nonlinear compensators based on the Volterra inverse; 1996; Proceedings of the 8th IEEE Signal Processing Workshop on Statistical Signal and Array Processing (SSAP '96); pp. 387-390.*

* cited by examiner

*Primary Examiner*—David C. Payne
*Assistant Examiner*—Adolf DSouza
(74) *Attorney, Agent, or Firm*—Frommer Lawrence & Haug LLP; William S. Frommer

(57) ABSTRACT

Predistortion effective for a power amplifier with the memory effect is provided. An A/D converter digitizes a signal voltage value after quadrature modulation, and the result is supplied to a subtractor. A lookup table outputs voltage value data in accordance with an output of the subtractor. The output of the lookup table is used as address data for accessing respective lookup tables. The lookup tables output an accumulation adding value derived from multiplying, by impulse responses, the signal voltage value after quadrature modulation and supplies it to the subtractor. The voltage value data outputted from the lookup table is converted by a D/A converter to output it as a predistortion signal for amplitude component for the power amplifier.

6 Claims, 9 Drawing Sheets

DISTORTION COMPENSATION CIRCUIT, AND A TRANSMISSION APPARATUS INCLUDING THE SAME

BACKGROUND OF THE INVENTION

1. Field of the Invention

This invention relates to a distortion compensation circuit for compensating distortion in a power amplifier and particularly to a distortion compensation circuit with so-called Memory-effect and to a transmission apparatus to which the distortion compensation circuit is applicable.

2. Description of the Related Art

Recently, in cellular phone systems, new systems have been developed such as a W-CDMA (Wideband-Code Division Multiple Access), CDMA (Code Division Multiple Access) 2000, which are called as the third generation system. In these cellular phone systems, an occupied bandwidth per one channel becomes considerably wider than that in a conventional PDC (Personal Digital Cellular) and PHS (Personal Handyphone System: Trademark). More specifically, the above-described occupied bandwidth per one channel is, for example, in the PDC, about 20 KHz and, in the PHS, it is about 200 KHz. Further, the occupied bandwidth in the CDMA 2000 is about 1.2 MHz and that in the W-CDMA becomes about 4 MHz.

Here, if a signal having a wide bandwidth, such as signals handled in the CDMA 2000 and the W-CDMA, is amplified, it becomes difficult to keep the characteristics of the amplifier within the band flat. Particularly, since requirements for distortion in a power amplifier (PA) is severe, designing of such power amplifier tends to be difficult. On the other hand, the distortion compensation technology is useful for improving distortion in a power amplifier and improving the efficiency thereof. However, it is difficult to efficiently compensate distortion in power amplifiers having a large deviation over its band. Thus, there is no appropriate method of compensating distortion in such power amplifier.

On the other hand, as an example of technology for compensating distortion in a power amplifier having the so-called Memory-effect, a Predistortion method is disclosed in which a predistortion signal is generated in a baseband section with a DSP (Digital Signal Processor). For example, J. Kim and K. Konstantinou "Digital predistortion of wideband signals based on power amplifier model with memory", IEEE Electronics letters, 8th Nov. 2001, Vol. 37, No. 23, pp. 1417-1418 discloses this.

According to the technology disclosed in this document, a signal voltage at a sample point is compared with a signal voltage at a previous sample point by one sample with regard to a baseband signal sequence, and a predistortion signal generation section generates a predistortion signal on the basis of the comparison result.

However, in this method of generating a predistortion signal, because the predistortion signal is generated at the baseband section, it is difficult to compensate distortion over the entire bandwidth of the power amplifier. In addition, because the predistortion signal is generated by comparison with only one-sampling previous value, this method has no effect on power amplifiers showing the strong memory effect.

SUMMARY OF THE INVENTION

An aspect of the present invention provides a distortion compensation circuit through a predistortion technology effective for power amplifiers with the memory effect and a transmission apparatus including the same.

According to the present invention, the present invention provides a distortion compensation circuit includes an A/D converter for digitizing a signal voltage value of a signal after quadrature modulating a baseband signal, a subtractor supplied with the output data of the A/D converter, a voltage value data output section for outputting a voltage value data corresponding to the output data of the subtractor by selecting from a plurality of pieces of previously stored voltage value data, an amplitude impulse response accumulation adding section for supplying, to the subtractor in accordance with the voltage value data from the voltage value data outputting section, an accumulation adding value of values obtained by multiplying the signal voltage value after quadrature modulation by impulse response values corresponding to amplitude characteristic of the power amplifier, a D/A converter for converting the voltage value data from the voltage value data outputting section into an analog signal as an output predistortion signal regarding the amplitude component of the power amplifier.

Another aspect of the present invention provides a transmission apparatus includes a quadrature modulation section for quadrature-modulating a transmission baseband signal, a distortion compensation circuit according to the present invention, and a conversion/removing section supplied with the output signal from the distortion compensation circuit for effecting frequency conversion and removal of electromagnetic interference (EMI).

In still another aspect of the present invention, the predistortion signal for compensating distortion in a power amplifier is generated from the signal after quadrature modulation of the baseband signal.

Still further aspect of the present invention provides compensation of distortion over the entire bandwidth of a power amplifier with the memory effect.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE PREFERRED EMBODIMENT

Figure 1:
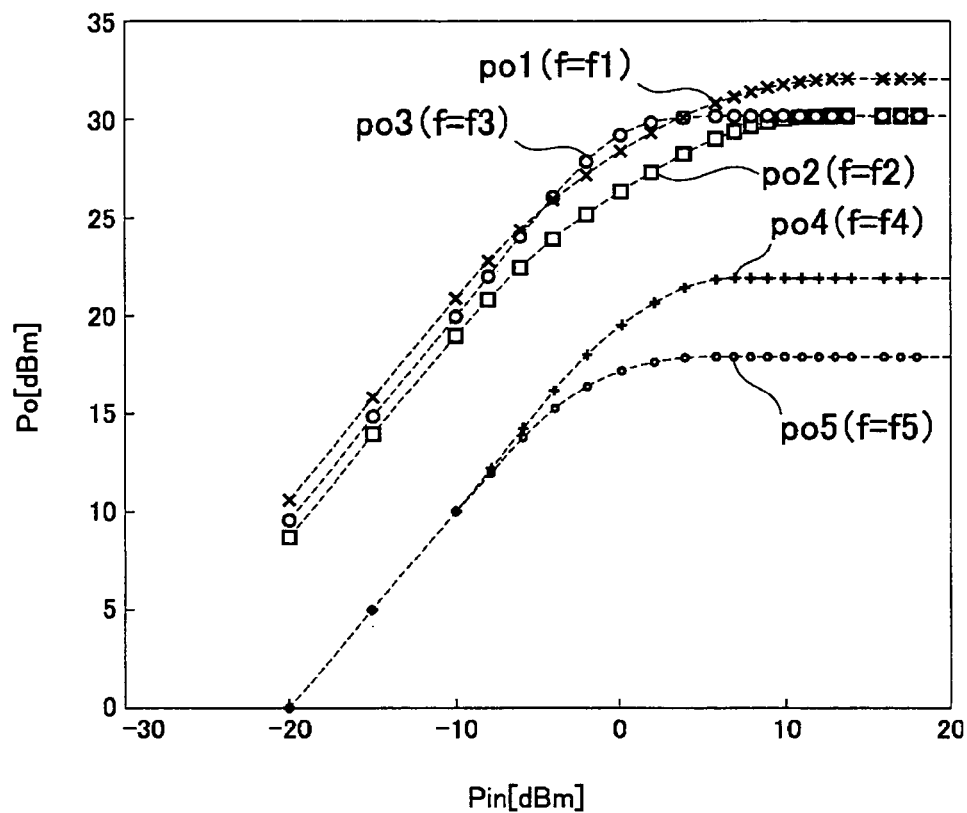
FIG. 1 is a graphical drawing illustrating input/output characteristics of a power amplifier with the memory effect used in the transmission apparatus according to the present invention.

A preferred embodiment will be described with reference to the attached drawings.

Operation Principle of Distortion Compensation

First, an operation principle of distortion compensation according to the present invention will be described.

Assuming that a time function of an input signal voltage of a power amplifier is u(t), and that a time function of an output signal voltage of the power amplifier is y(t), an input/output characteristic of the power amplifier is generally given by:

$$y(t) = \int_0^t h_1(\tau)u(t-\tau)d\tau + \int\int_\tau h_2(\tau_1, \tau_2)u(t-\tau_1)u(t-\tau_2)d\tau_1 d\tau_2 + \cdots \quad (1)$$

where $h_k(\tau_1, \cdots, \tau_k)$ is $k^{th}$ order Volterra kernel representing $k^{th}$ order non-linear impulse response. In addition, n-multiple integral term (n is a natural number) in the Equation (1) provides an output of $n^{th}$ order components of the input signal voltage u(t). That is, for example, the quintuple integral term provides a fifth order component, an IM (Inter Modulation) 5 component, and a fundamental wave component and an IM 3 component generated from the fifth order term.

Next, the Equation (1) is subjected to Fourier transform to provide an Equation (2). That is, the above-described Equation (1) represents the input/output characteristic of the power amplifier in time domain, and the Equation (2) represents the input/output characteristic of the power amplifier in frequency domain.

$$Vout(\omega) = H1(\omega) \cdot Vin(\omega) + H2(\omega1,\omega2) \cdot Vin(\omega)^2 + H3(\omega1, \omega2, \omega3) \cdot Vin(\omega)^3 + \quad (2)$$

where Vin(ω) represents Fourier transform of the input signal voltage u(t), and Vout(ω) represents Fourier transform of the output signal voltage y(t). In addition, in the Equation (2), ω1, ω2, and ω3 represent frequency components of the input signal Vin to be supplied to the power amplifier. Hn(ω) represents Fourier transform of Volterra kernel. Here, Hn(ω) is generally a complex number.

Here, in the power amplifier of which distortion is to be compensated, the memory effect means in the Equation (2) that the frequency dependency of Hn(ω) is so large that it cannot be neglected. Thus, the Equation (2) represents both of so-called AM/AM and AM/PM characteristics.

Thus, in the condition that an input signal voltage to the power amplifier is such that the characteristic of the power amplifier is linearized by distortion compensation, Equation (3) or (4) is to be satisfied. In these Equations (3) and (4), G0 represents a linear gain of the power amplifier. Further, when the Equation (3) or (4) is satisfied, the power amplifier having the linear gain G0 does not show any memory effect, and becomes a Memory-less power amplifier.

$$G0 \cdot u(t) = \int_0^t h_1(\tau)u(t-\tau)d\tau + \int\int_\tau h_2(\tau_1, \tau_2)u(t-\tau_1)u(t-\tau_2)d\tau_1 d\tau_2 + \cdots \quad (3)$$

$$G0 \cdot Vin(\omega) = H1(\omega1) \cdot Vin(\omega) + H2(\omega1, \omega2) \cdot Vin(\omega)^2 + H3(\omega1, \omega2, \omega3) \cdot Vin(\omega)^3 + \cdots \quad (4)$$

Therefore, the generation of the predistortion signal results in obtaining the input voltage u(t) satisfying the Equation 3 or Equation 4.

Hererinafter, operation of distortion compensation according to the present invention will be described with an example.

Figure 2:
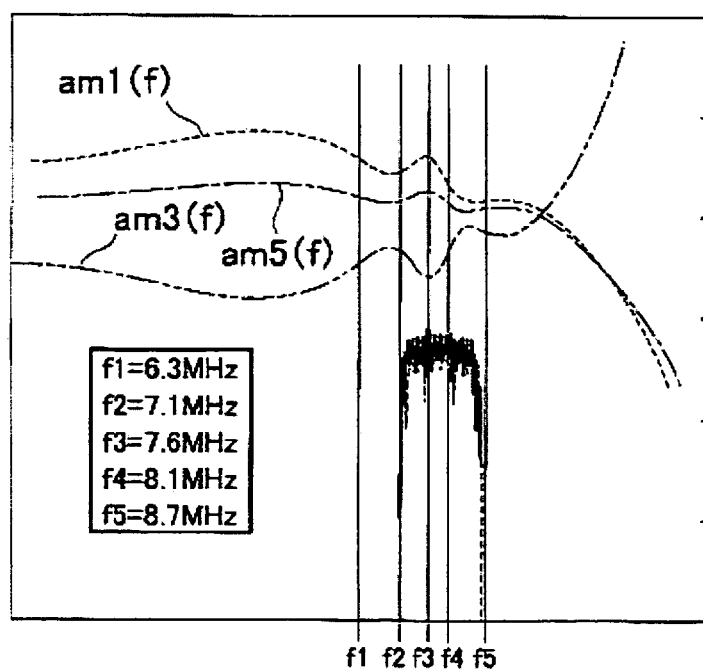
FIG. 2 is a graphical drawing illustrating AM/AM characteristics of the power amplifier with the memory effect shown in FIG. 1.

FIGS. 1 and 2 illustrate input/output characteristics of an exemplified power amplifier with the memory effect, i.e., a Memory-System. Five curves po1, po2, po3, po4, and po5 in FIG. 1 show input/output characteristics corresponding to respective frequencies f1 to f5 in FIG. 2. Here, since the input/output characteristics in FIG. 1 are represented in power, they are converted to represent the input/output characteristics in voltage, and these five input/output characteristics are approximated with fifth order polynomial given by:

$$Vo(fi) = am1(fi) \cdot Vin(fi) + am3(fi) \cdot Vin^3(fi) + am5(fi) \cdot Vin^5(fi) \quad (5)$$

where i=1, 2, 3, 4, 5. Then, smoothly connecting am1(fi), am3(fi), and am5(fi) obtained by the Equation 5 in a direction of frequency provides respective curves shown in FIG. 2.

Figure 3:
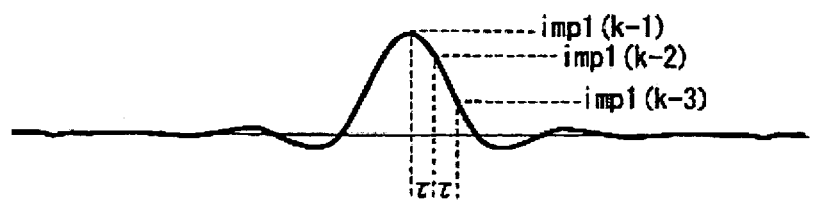
FIG. 3 is a graphical drawing illustrating an example of impulse response of the power amplifier with the memory effect shown in FIG. 1.
Figure 4:
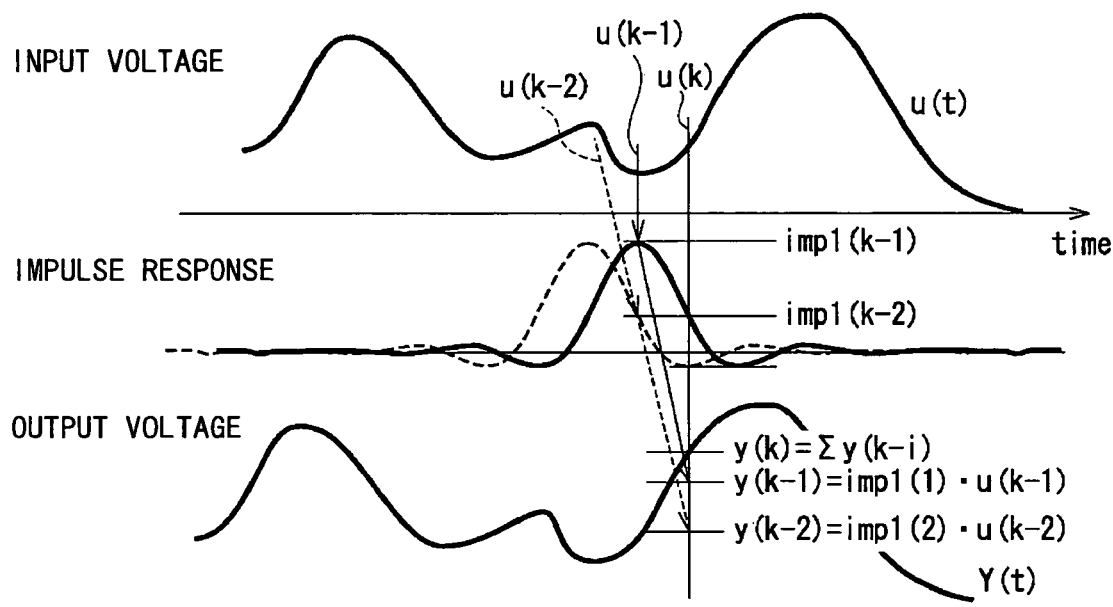
FIG. 4 is a graphical drawings illustrating convolution integration using the impulse response shown in FIG. 3.

Here, from studying variation in time of the output voltage of the power amplifier having the input/output characteristics represented by the Equation (5), am1(fi), am3(fi), and am5 (fi) in the Equation (5) can be considered as representation of filter characteristics. Therefore, the responses of these filters can be represented by convolution integration with impulse responses. FIGS. 3 and 4 show this operation, where FIG. 3 shows a value imp(i) of impulse response at every sampling point (sampling interval τ) and FIG. 4 shows the convolution integration with these impulse responses.

Further, if it is assumed that "i" and "k" in FIGS. 3 and 4 are considered as sampling points by digitizing the signal in time base, the output signal voltage u(k) at a time k is an accumulation adding value of products of past input signal voltages u(k−1), u(k−2), - - - , and respectively corresponding impulse responses as given by:

$$y(k) = \sum_{i=1}^{n} u(k-i) \cdot imp1(i) + \sum_{i=1}^{n} u(k-i)^3 \cdot imp3(i) + \sum_{i=1}^{n} u(k-i)^5 \cdot imp5(i) \quad (6)$$

where imp(i) in the Equation (6) represents an impulse response of am(i) in the Equation (5). Further, "n" in the Equation (6) is a natural number, for example, n=4.

Here, if the power amplifier would not have the memory effect, that is, it would be a Memory-Less System, because the duration of the impulse response is extremely short, the above-described accumulation adding value is negligible. However, if the power amplifier has the memory effect, that is, it is a Memory System, the above-described accumulation adding value adversely effects. Particularly, the third order and fifth order terms in the Equation (6) represent distortion, which is influenced from accumulated past distortion.

The above-description provides time domain behavior if the power amplifier has the memory effect, i.e., it is a Memory System.

In consideration of these facts, the distortion compensation circuit according to the present invention provides distortion compensation of the power amplifier as follows:

A predistortion signal for distortion compensation for a power amplifier, that is, the input signal voltage u(k) to the power amplifier satisfies Equations (7-1), (7-2), and (7-3) from above-mentioned Equations (3) and (6).

$$y(k) = G0 \cdot u(k-1) \quad (7\text{-}1)$$

$$= \sum_{i=1}^{n} u(k-i) \cdot imp1(i) + \sum_{i=1}^{n} u(k-i)^3 \cdot imp3(i) +$$

$$\sum_{i=1}^{n} u(k-i)^5 \cdot imp5(i)$$

$$= u(k-1) \cdot imp1(1) + u(k-1)^3 \cdot imp3(1) + u(k-1)^5 \cdot imp5(1) + \quad (7\text{-}2)$$

$$\sum_{i=2}^{n} u(k-i) \cdot imp1(i) + \sum_{i=2}^{n} u(k-i)^3 \cdot imp3(i) +$$

$$\sum_{i=2}^{n} u(k-i)^5 \cdot imp5(i)$$

$$= u(k-1) \cdot imp1(1) + u(k-1)^3 \cdot imp3(1) + \quad (7\text{-}3)$$

$$u(k-1)^5 \cdot imp5(1) + hf(i)$$

where the Equation (7-2) represents terms (k-1) apart from other terms. Further, in the Equation (7-3), terms of $\Sigma$ is replaced with hf(i). Then, when u(k-2), u(k-3), u(k-4), - - - are determined, hf(i) in the Equation (7-3) is determined and u(k-1) satisfying the Equation (7-3) is determined. That is, this u(k-1) is a predistortion signal to be outputted when i=1.

Figure 5:
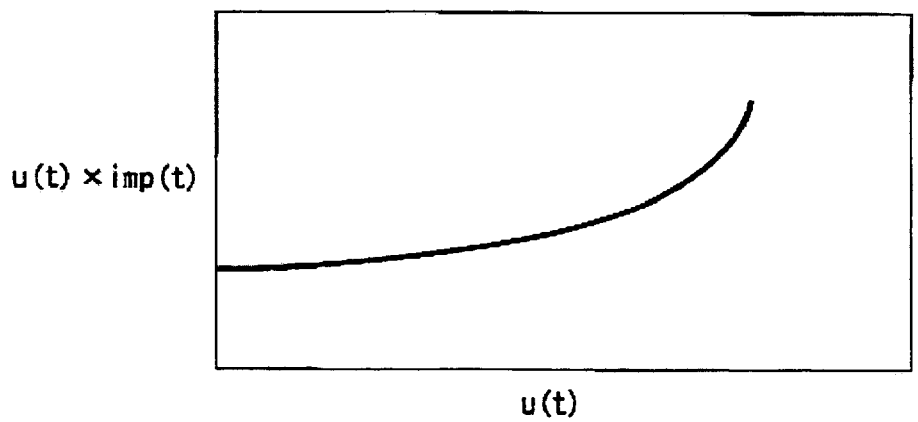
FIG. 5 is a graphical drawing illustrating an example of a curve of data stored in a lookup table used in a distortion compensation circuit according to the present invention.

The distortion compensation circuit according to the present invention uses lookup tables for obtaining the hf(i). More specifically, lookup tables are prepared correspondingly to time intervals $\tau$ shown in FIG. 3, respectively, wherein each lookup table stores a value of imp(i)×u(k-i) at each time interval $\tau$. In other words, the distortion compensation circuit according to the present invention stores, in the lookup table, values obtained by previously multiplying, by imp(*), possible values in the entire voltage range of the input signal voltage u(t) to be inputted to the power amplifier. Then, changing an access point of each lookup table in accordance with the input value provides the value obtained by multiplying the input value by the impulse response. FIG. 5 shows an example of data in the lookup table used in the distortion compensation circuit according to the present invention.

Further, the distortion compensation circuit according to the present invention also uses a lookup table for obtaining u(k-1) satisfying the Equation (7-3).

In addition, the distortion compensation described above is effected with respect to amplitude of the signal. However, the distortion compensation circuit according to the present invention also provides distortion compensation in the phase direction in the same manner. That is, if AM/PM characteristics are different at every frequency, phase compensation is represented by replacing am(*) in the Equation (5) with those at obtained from frequency dependency of AM/PM as follows:

$$Phout(fi) = pm1(fi) \cdot Vin(fi) + pm2(fi) \cdot Vin^2(fi) + pm3(fi) \cdot Vin^3(fi) + \quad (8)$$

where Phout(fi) represents a phase component of the output signal of the power amplifier, and pm(*) is similar to am(*) in the Equation (5) and obtained from the frequency characteristic of AM/PM. Using pm(*) in the Equation (8) provides Pho(t) representing variation in Phout(fi) in a time base. The distortion compensation in the phase direction is provided from Pho(t) by shifting the phase of the input signal to the power amplifier by that PhPD(t)=−Pho(t).

Application Example of Distortion Compensation Circuit

Figure 6:
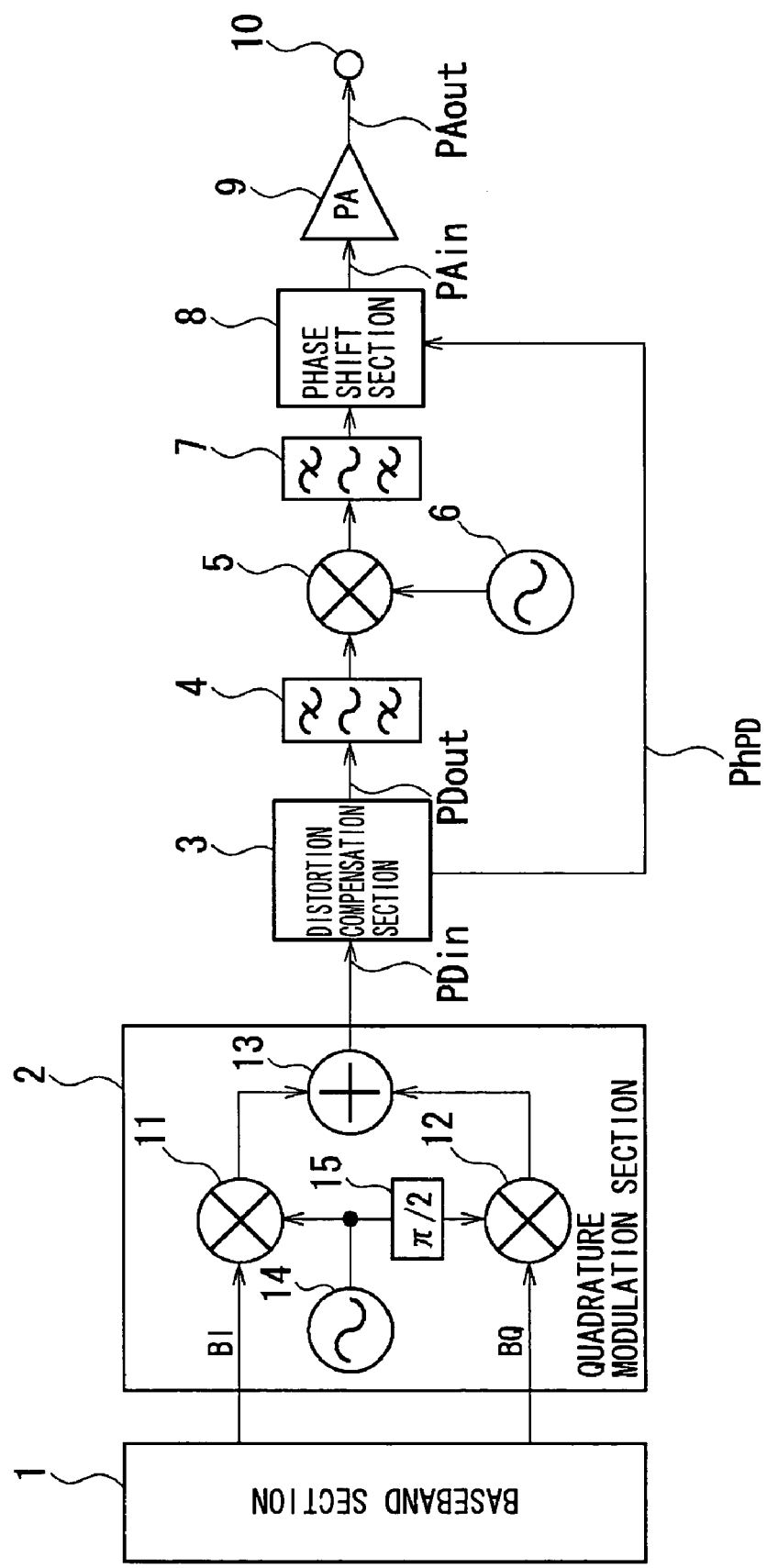
FIG. 6 is a block diagram of a transmission section of a portable telephone terminal using the distortion compensation circuit according to the present invention.

FIG. 6 shows a general structure of a transmission section (transmission apparatus) of a portable telephone terminal to which the above-described distortion compensation circuit according to the present invention is applied.

In FIG. 6, the baseband section 1 supplies an in-phase component signal BI and a quadrature component signal BQ to a quadrature modulation section 2. The in-phase component signal BI is supplied to one mixer 11 in the quadrature modulation section 2. The quadrature component signal BQ is supplied to the other mixer 12 in the quadrature modulation section 2. The mixer 11 is supplied with an oscillation signal from an oscillator 14, and the other mixer 12 is supplied with a signal phase-shifted by 90 degrees ($\pi/2$). Thus, the mixer 11 frequency-converts the in-phase component signal BI with the oscillation signal, and the other mixer 12 frequency-converts the quadrature component signal BQ with the 90-degree phase-shifted oscillation signal. An adder 13 adds these output signals of the mixers 11 and 12 to each other and supplies its output as an output of the quadrature modulation section 2 to a distortion compensation section 3 as its input signal PDin.

The distortion compensation section 3 generates the predistortion signal PDout for compensating distortion in the direction of the amplitude of the power amplifier at the final stage and the predistortion signal PhPD for compensating distortion in the phase direction by changing access points of the above mentioned lookup table in accordance with the input signal PDin. The predistortion signal PDout in the amplitude direction is supplied to a bandpass filter 4 and the predistortion signal PhPD in the phase direction is supplied to a phase shift section 8.

The bandpass filter 4 removes EMI components included in the predistortion signal PDout for compensation in the amplitude direction. The output signal of the bandpass filter 4 is supplied to a mixer 5. The mixer 5 is further supplied with an oscillation signal from a radio frequency oscillator 6. Thus, the mixer 5 frequency-converts the output signal of the bandpass filter 4 with the oscillation signal from the radio frequency oscillator 6. The radio frequency signal from the mixer 5 is supplied to a bandpass filter 7. The bandpass filter 7 removes EMI components included in the radio frequency signal outputted from the mixer 5. The output signal of the bandpass filter 7 is supplied to the phase shift section 8.

The phase shift section 8 is supplied with the predistortion signal PhPD for compensation in the phase direction from the distortion compensation section 3 as a phase shift control signal to phase-shift the output signal from the bandpass filter 7. That is, the phase shift section 8 outputs a predistortion signal PAin for compensating distortion both in amplitude and phase directions in the power amplifier 9. Thus, the output signal PAout of the power amplifier 9 is distortion-compensated. The output PAout of the power amplifier 9 is supplied to a rear stage structure (not shown) through a terminal 10.

Here, since the portable telephone terminal according to the embodiment obtains the predistortion signal PDout for compensation in amplitude direction and the predistortion signal PhPD for compensation in phase direction by accessing the lookup tables in accordance with the input signal PDin, this embodiment particularly takes the following points into consideration.

The oscillation frequency of the oscillator 14 in the quadrature modulation section 2 in FIG. 6 is relative low such that it is about twice an envelope frequency of signals BI and BQ from the baseband section 1. The reason is as follows:

Generally, frequency conversion operation with a mixer or the like also generates an image component, so that the occupied frequency bandwidth becomes twice that of the original signal (the output of the quadrature modulation section 2 in this embodiment). In this case, the memory effect to be considered occurs at a frequency band two or more times the envelope frequency. Thus, the distortion compensation should be made in consideration of this frequency band. However, because the distortion compensation according to the present embodiment, as described above, requires the digital process such that lookup tables are accessed in accordance with the input signal PDin, it is difficult to process data at such a high frequency. Then, in this embodiment, the oscillation frequency of the oscillator 14 is made low such that it is about twice the envelope frequency of the signals BI and BQ to simplify the digital process.

Figure 7:
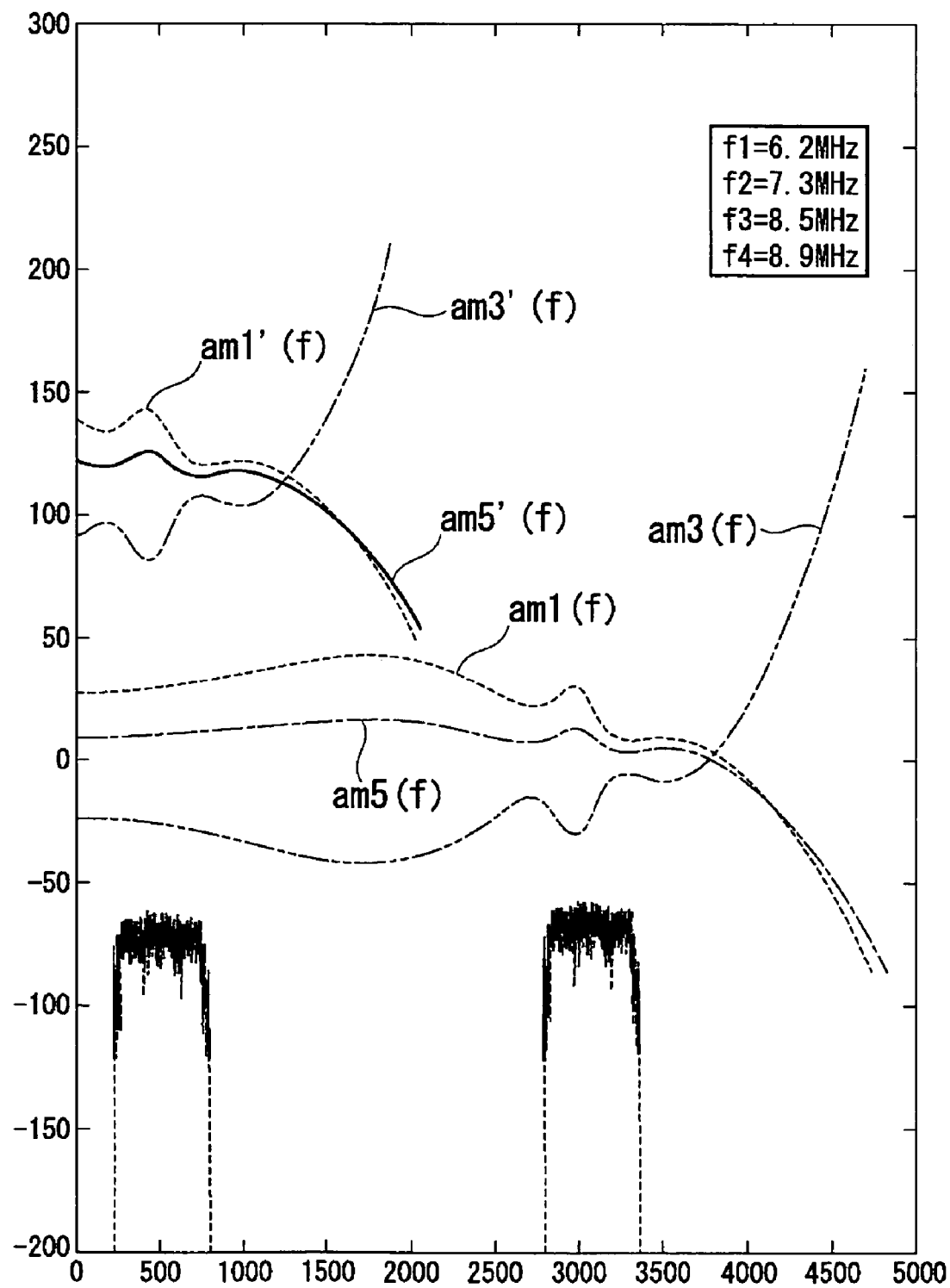
FIG. 7 is a graphical drawing illustrating a frequency relation between the memory effect of the power amplifier and distortion compensation according to the represent invention.

Further, the distortion compensation according to the present embodiment generates the predistortion signal with impulse response from the signal modulated as mentioned above. During this, values stored as impulse response in the lookup table are derived from impulse responses of am1'(f), am3'(f), and am5'(f) shifted, as shown in FIG. 7, to a low frequency region from am1(f), am3(f), and am5(f) in FIG. 2. FIG. 7 is a drawing illustrating simulation to check the distortion compensation effect according to the present invention. This simulates an example in which the oscillation frequency of the oscillator 14 is set to the frequency (1.3 MHz) twice the envelope frequency (=1.2288 MHz/2) of the signals BI and BQ from the baseband section 1. That is, if the radio frequency is 1.3 MHz×6=7.8 MHz, the memory effect of the power amplifier in FIG. 6 is represented by am1(f), am2(f), and am5(f) near 7.8 MHz. However, the distortion compensation section 3 according to the present embodiment accesses the lookup table with am1'(f), am3'(f), and am5'(f) shifted at a frequency range near 1.3 MHz from am1(f), am2(f), and am5(f) in parallel.

Configuration of Distortion Compensation Section

Figure 8:
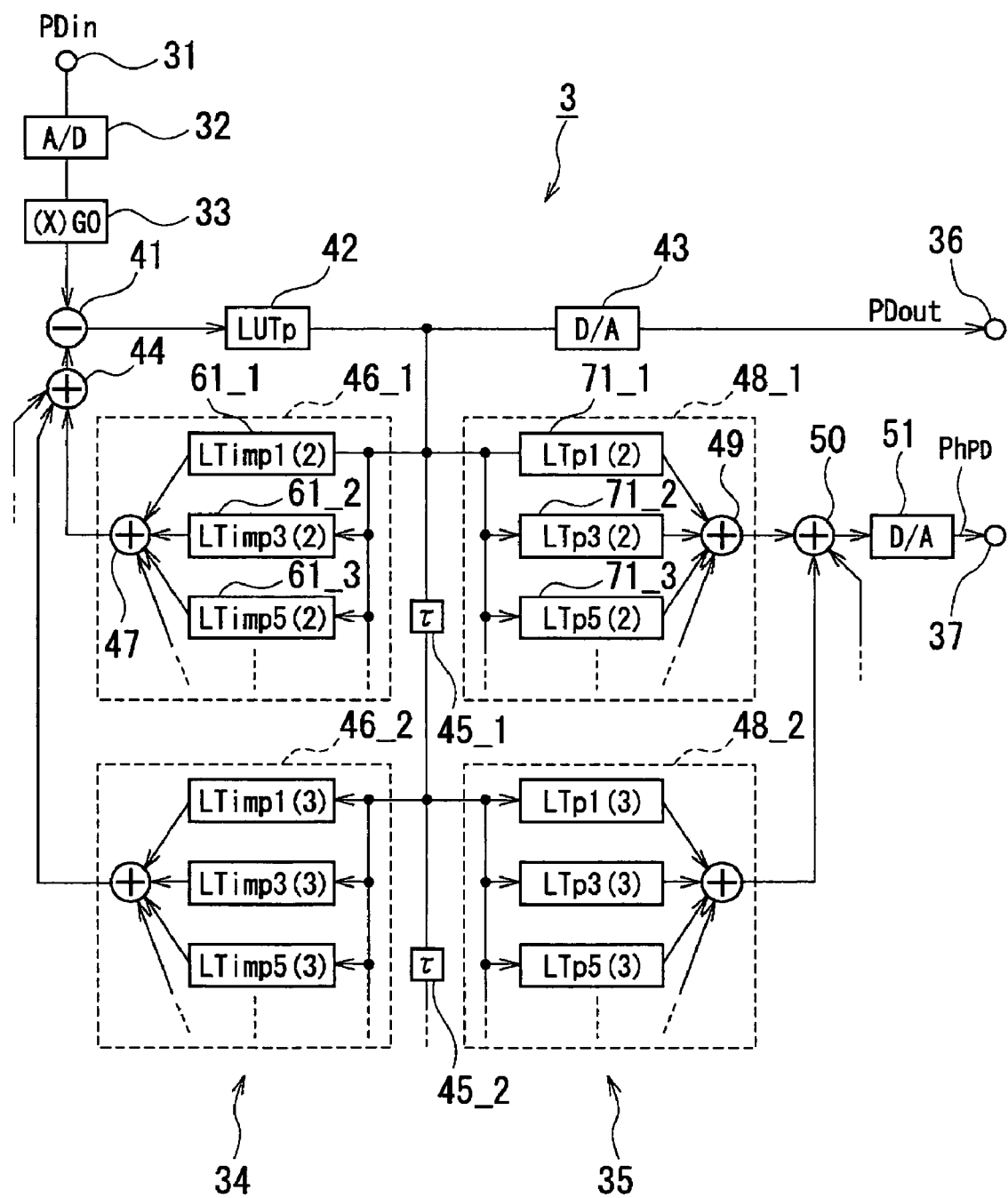
FIG. 8 is a bock diagram of the distortion compensation section according to the present invention.

The distortion compensation section 3 according to the present embodiment will be described about structure for generating predistortion signals by accessing to lookup tables in accordance with the input signal PDin. FIG. 8 illustrates an example of a distortion compensation section 3 according to this embodiment.

The distortion compensation section 3, shown in FIG. 8, includes an A/D (analog to digital) converter 32 for digitizing the input signal PDin from the quadrature modulation section 2, a multiplier 33 for multiplying the output of the A/D converter 32 by a constant G0, a subtractor 41 supplied with the output of the multiplier 33, a lookup table (power value data output means) 42 supplied with at least a part of the output data of the subtractor 41 as address data for accessing the lookup table 42, a delay block including N−1 delays 45_1, 45_2, - - - for successively delaying the output of the lookup table 42 by τ, respectively (N is a natural number and in this embodiment, N=3 or 4), N table blocks 46_1, 46_2, - - - supplied with the output data successively delayed by τ (output data of the lookup table 42 or output of the delay 45_1 or 45_2 - - - ), an adder 44 for summing output data of the these table blocks 46_1, 46_2, - - - to supply the result to the subtractor 41, and a D/A (Digital to Analog) converter 43, which are provided as an amplitude compensation section 34 for outputting the predistortion signal PDout from the output of the D/A converter 43 through a terminal 36 for compensation in the amplitude direction.

The first stage of the table block 46_1 among the respective table blocks 46_1, 46_2, - - - in the amplitude compensation section 34 is supplied with at least a part of the output data of the lookup table 42 as address data for accessing the tables. The table block 46_1 includes. M lookup tables 61_1, 61_2, 61_3, - - - , each including memory elements and outputting a piece of data from previously stored data in accordance with the address data (M is a natural number and M=4 in this embodiment), and an adder 47 for adding the output values of the lookup tables 61_1, 61_2, 61_3, - - - to each other. The output data of the adder 47 is supplied to the adder 44. The second stage of table block 41_2 has the same structure as the first stage of table block 46_1, but is supplied as table access address data with the output data of the delay 45_1 which is delayed by τ from the output data of the lookup table 42. The table blocks 46_3, - - - (not shown) after the second stage of table block 46_2 are similarly provided, wherein the output data of the lookup table 42 is successively delayed by τ with the delays 45_2, and successively delayed data pieces are supplied to table blocks 46_3, - - - as address data pieces for accessing tables, respectively. This structure corresponds to the amplitude impulse response accumulation additional means.

The lookup tables 61_1, 61_2, 61_3, - - - of the table blocks 46_1, 46_2, - - - in the amplitude compensation section 34 store values obtained by multiplying past input signal voltages by impulse responses derived from the above-mentioned am1'(f), am3'(f), and am5'(f), respectively. For example, the first stage lookup table 61_1 stores values of $u(k-2) \cdot imp'1(2)$, the second stage of lookup table 61_2 stores $u(k-2)^3 \cdot imp'3(2)$, and the third stage of lookup table 61_3 stores $u(k-2)^5 \cdot imp'5(2)$.

The lookup table 42 stores values of $u(k-1)$ in the solution satisfying Equation (9).

$$G0 \cdot u(k-1) = u(k-1) \cdot \text{imp}'1(1) + u(k-1)^3 \cdot \text{imp}'3(1) + u(k-1)^5 \text{imp}'5(1) \quad (9)$$

where imp'1(i), imp'3(i), and imp'5(i) represent impulse responses obtained from am1'(f), am3'(f), and am5'(f), respectively. Further, the constant G0, used for multiplying in the multiplier 33, represents a linear gain when the characteristic of the power amplifier 9, of which distortion is to be compensated, is linearized. As mentioned above, the distortion compensation section 3 according to this embodiment uses the output of the lookup table 42 as address data for the lookup tables 61_1, 61_2, 61_3, - - - in the table blocks 48_1, 48_2, - - - . This is because the signal actually inputted to the power amplifier 9 is that pre-distorted, and thus it is necessary to consider the output value of the lookup table 42 as the input signal sequence.

The distortion compensation section 3 with the structure mentioned above converts the input signal PDin supplied at the terminal 31 and multiplying it by G0. The multiplied data is supplied to the lookup table 42 for accessing. At least part of the output of the lookup table 42 is supplied to the lookup tables 61_1, 61_2, 61_3, - - - in the table blocks 48_1, 48_2, - - - for accessing to obtain u(k−2)·imp1(2) or the like in the Equation (7-3). Next, outputs of these lookup tables 61_1, 61_2, 61_3, - - - are added to each other at the adder 47 to provide hf(i) in the Equation (7-3). Further, the subtractor 41 subtracts the output data of the adder 47 from the output data of the multiplier 33 (PDin·G0) to obtain signal sequence for accessing the lookup table 42. The output of the lookup table 42 is D/A-converted to provide the analog predistortion PDout for compensation in the amplitude direction.

The distortion compensation section 3, as shown in FIG. 8, further includes N table blocks 48_1, 48_2, - - - supplied with output data of the lookup table 42 successively delayed by τ with the delays 45_1, 45_2, - - - , an adder 50 for adding the outputs of these table blocks 48_1, 48_2, - - - to each other, and a D/A converter 51 for D/A-converting the output data of the adder 50, which are provided as a phase compensation section 35.

The first stage of the table block 48_1 among the respective table blocks 48_1, 48_2, - - - in the phase compensation section 35 is supplied with at least a part of the output data of the lookup table 42 as address data for accessing the tables. The table block 48_1 includes M lookup tables 71_1, 71_2, 71_3, - - - , each including memory elements and outputting a piece of data from previously stored data in accordance with the address data, and an adder 49 for adding the output values of the lookup tables 71_1, 71_2, 71_3, - - - to each other. The output data of the adder 49 is supplied to the adder 50. The second stage of table block 48_2 has the same structure as the first stage of table block 48_1, but is supplied, as table access address data, with the output data of the delay 45_1 which is delayed by τ from the output data of the lookup table 42. The table blocks 48_3, - - - (not shown) after the second stage of table block 48_2 are similarly provided, wherein the output data of the lookup table 42 is further successively delayed by τ and successively delayed data pieces are supplied to table blocks 48_3, - - - as address data pieces for accessing tables, respectively. This structure corresponds to the phase impulse response accumulation additional means according to the present invention.

In the phase compensation section 35, lookup tables 71_1, 71_2, 71_3, - - - , in of table blocks 48_1, 48_2, - - - store values derived by changing signs of impulse responses of coefficients pm (*) shown in the Equation (8), respectively.

Thus, the outputs of the lookup tables 71_1, 71_2, 71_3, - - - are summed by the adder 49, and the result is D/A-converted by the D/A converter 51 as the predistortion PhPD for compensation in the phase direction, which controls the phase shift in the phase shift section 8 to provide phase compensation.

In the distortion compensation section 3 in FIG. 8, the delay time τ of each of delays 45_1, 45_2, - - - represents the interval for digitizing in FIG. 3. It is better that the delay time τ is short. However, processing speeds of the used A/D converter 32, and the D/A converters 43 and 51 determine the lower limit.

Simulation of Distortion Compensation

Study of effects in distortion compensation according to the present invention through simulation was made. The result will be described below. The condition of simulation is the same as that described in FIG. 7. In addition, the delay time τ is determined by the condition of 16 times oversampling, i.e., 1/19.2 MHz=1.2288 Mcps×16.

Figure 9:
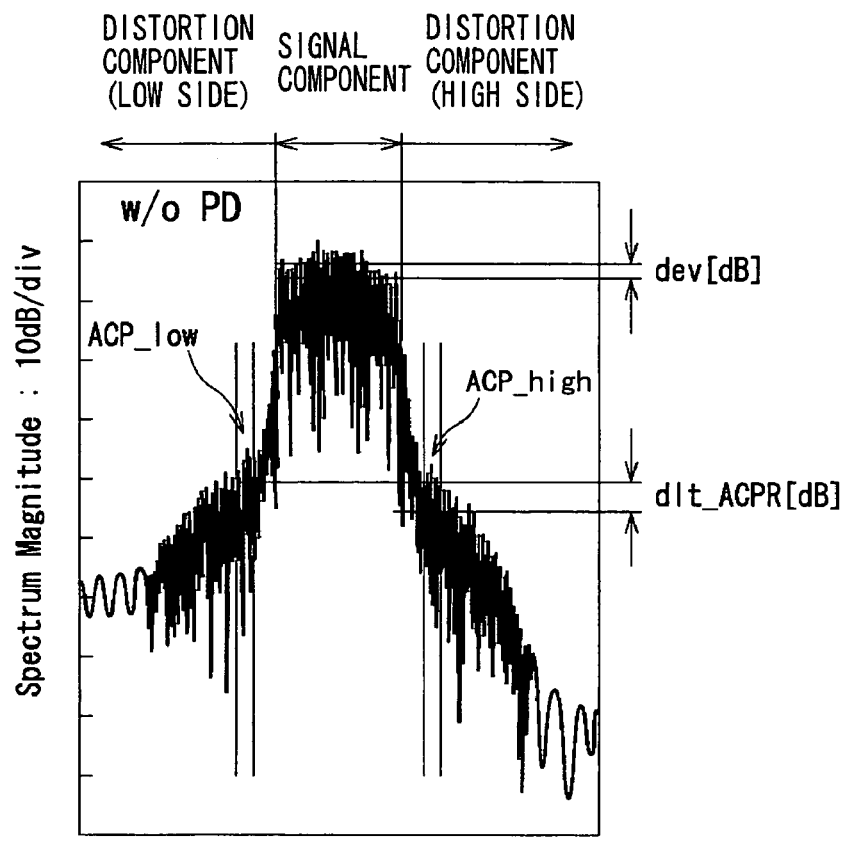
FIG. 9 is a graphical drawing illustrating a frequency component of the output signal of the power amplifier without distortion compensation, obtained through simulation.

FIG. 9 shows an example of spectrum of the output signal PAout with the characteristics of the power amplifier described in FIGS. 1 and 2 obtaining through simulation. The signal is used in uplinking in an N-CDMA (Narrowband-Code Division Multiple Access), and the chip rate is 1.2288 Mcps, and data modulation is OQPSK (Offset Quadrature Phase Shift Keying). The output signal PAout of the power amplifier is 21.5 dBm. The spectrum in FIG. 9 includes the signal component and distortion components as shown. The signal component shows deviation of about 2 dB within the band (=dev). This is one of characteristic of the memory effect and caused from the above-described am1(f). Further, there is a difference of about 4 dB in magnitude at ACPs, representing distortion (=±885 kHz, detuning points), between the high and low sides of the signal component (dlt_acpr=ACP_high—ACP_low). That is, asymmetrical distortion spectrum with respect to the high and low sides of the signal component is generated. Similarly, this is caused from above-described am3(f) and am5(f). Thus, if the power amplifier has a strong memory effect, it shows a characteristic that the output spectrum becomes asymmetrical.

Figure 10:
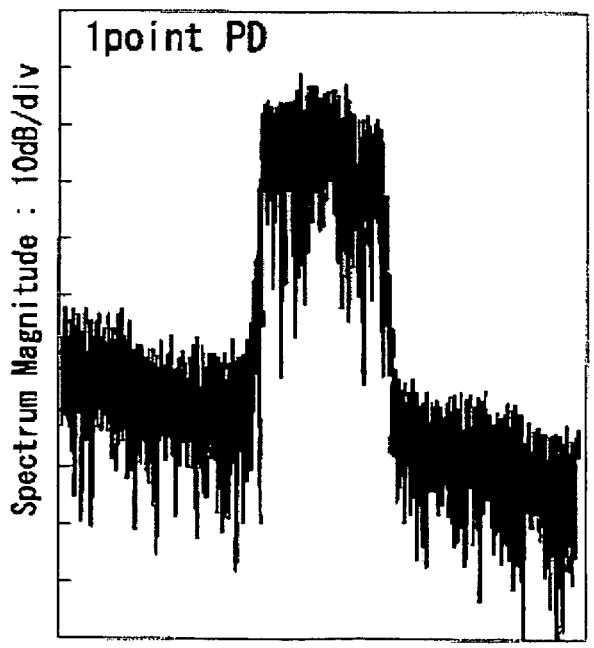
FIG. 10 is a graphical drawing illustrating a frequency component of the output signal of the power amplifier supplied with a predistortion signal obtained through simulation in consideration of the characteristic curve po3 shown in FIG. 1 without consideration of the memory effect.
Figure 11:
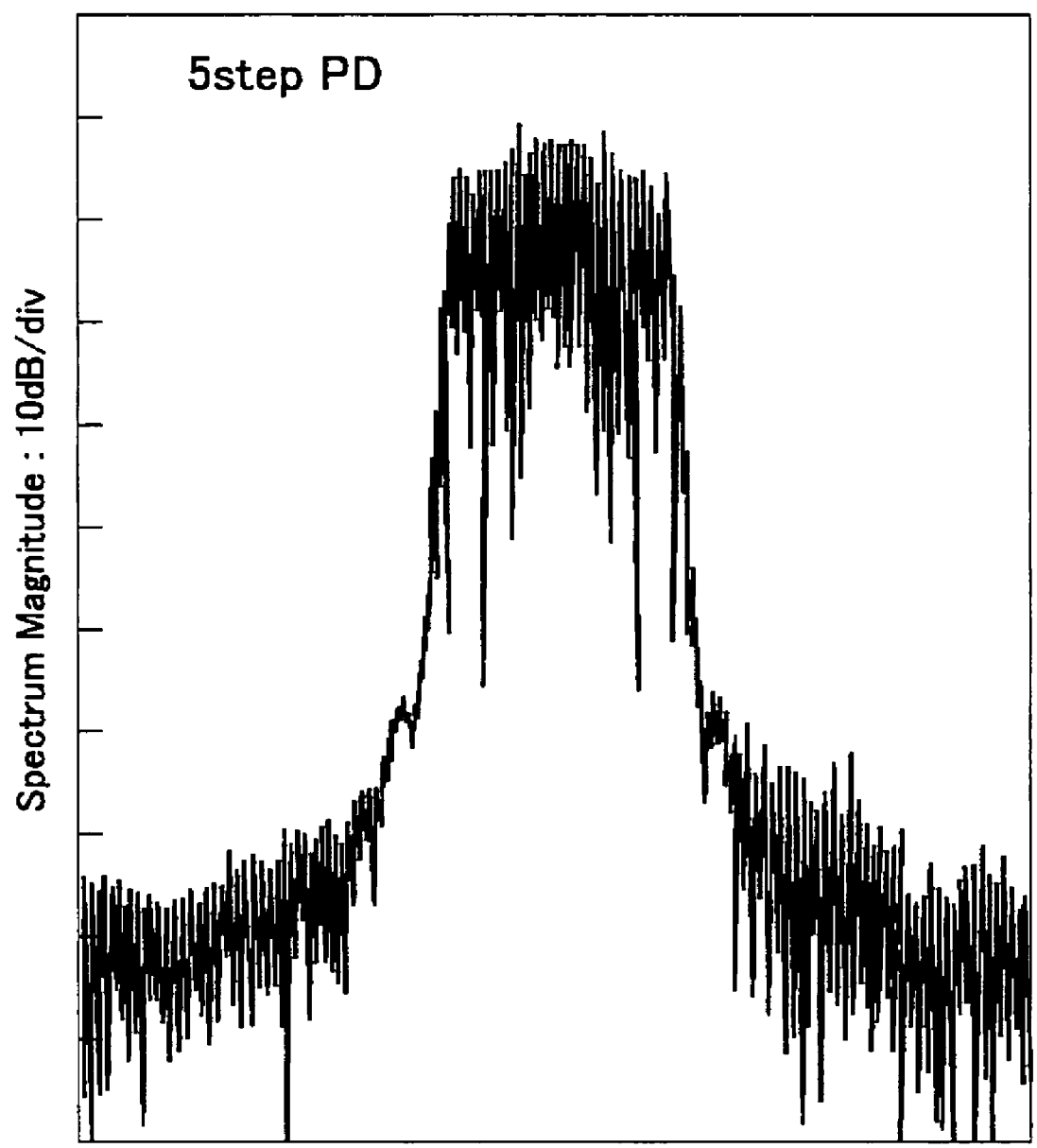
FIG. 11 is a graphical drawing illustrating a frequency component of the output signal of the power amplifier with distortion compensation according to the present invention, obtained through simulation.

FIGS. 10 and 11 show variation in spectrum between distortion compensation results according to two methods. FIG. 10 shows the effect of distortion compensation in an example wherein the AM/AM characteristic of f=f3 and a signal for linearizing, i.e., a predistortion signal obtained in consideration only of the characteristic of the curve po3 without consideration of the memory effect, are used. This spectrum is obtained when the output signal power of the power amplifier 9 is PAout=21.5 dBm. Hereinafter, this predistortion is referred to as "1 point PD". Similarly, FIG. 11 shows the predistortion according to a preferred example of the present invention using the Equation (7-3). The output signal power of the power amplifier 9 is also PAout=21.5 dBm. Further, the number of times of accumulating the past values used during obtaining hf(i) in the Equation (7-3) is set five. Hereinafter, this predistortion is referred to as "5 step PD". Further, the example in FIG. 9 is referred to as "w/o PD" because there is no distortion compensation. The example of "1 point PD" in FIG. 10 is observed as if the distortion compensation is effective. However, both of the deviation within band dev and asymmetric ACP are not reduced. Further, there is no improvement in distortion at a range where the detuning frequency is large. On the other hand, in the preferred example of "5 step PD" according to the present invention shown in FIG. 11, the deviation within the band dev and asymmetric ACP are eliminated and further, distortion, at the range where the detuning frequency is large, is sufficiently improved.

Figure 12:
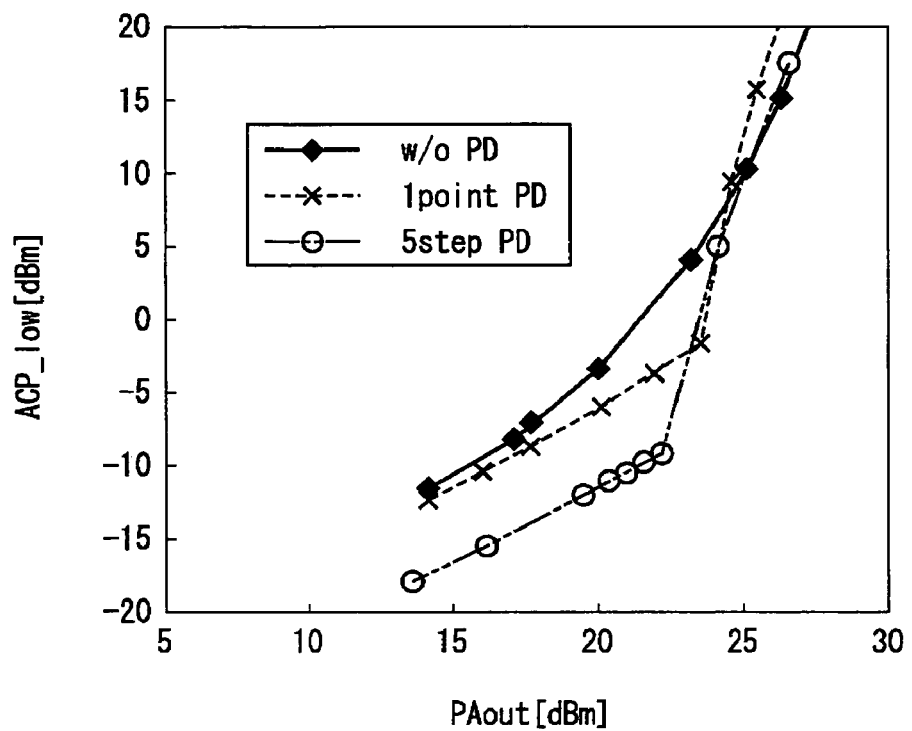
FIG. 12 is a graphical drawing illustrating output power dependencies of ACP_low for three cases shown in FIGS. 9 to 11.
Figure 13:
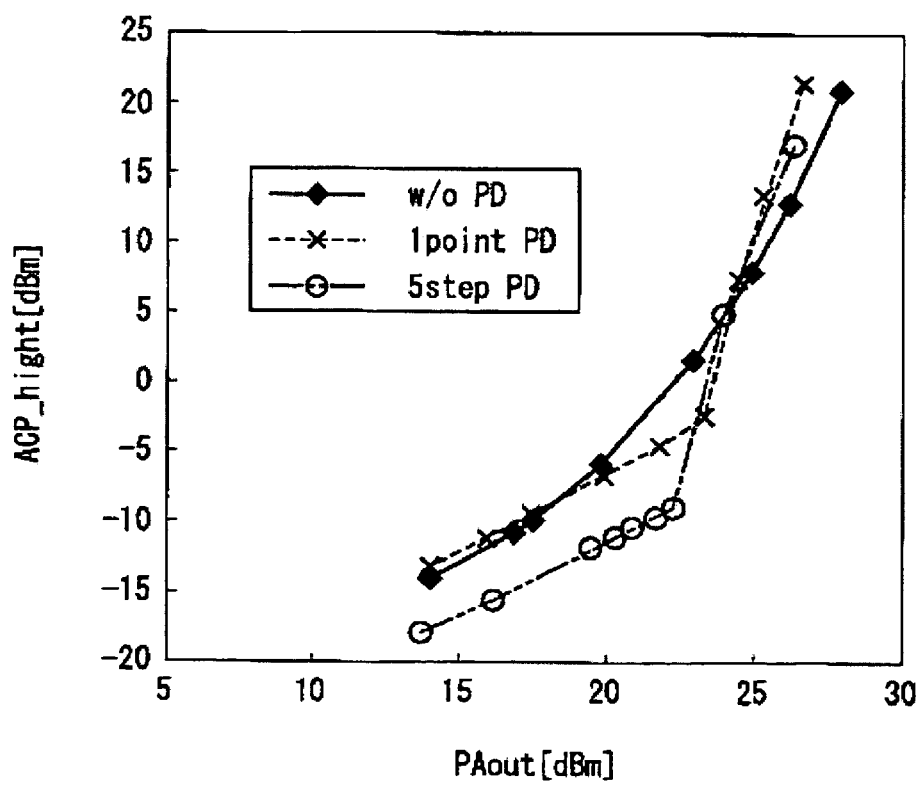
FIG. 13 is a graphical drawing illustrating output power dependencies of ACP_high for three cases shown in FIGS. 9 to 11.

Next, FIGS. 12 and 13 show output power dependencies of ACP_low and ACP_high, respectively, for three cases shown in FIGS. 9 to 11. In FIGS. 12 and 13, at the ranges where the output signal power of the power amplifier is low, there are no large difference in output dependencies of "1 point PD" and "5 step PD". At the range where the output signal power PAout is greater than 20 dBm, the output dependency of "5 step PD" shows improvement in ACP by equal to or more then 5 dB. At the range where the output signal power of the power amplifier 9 is large, there is no effect of distortion compensation because distortion due to clipping occurs there.

Figure 14:
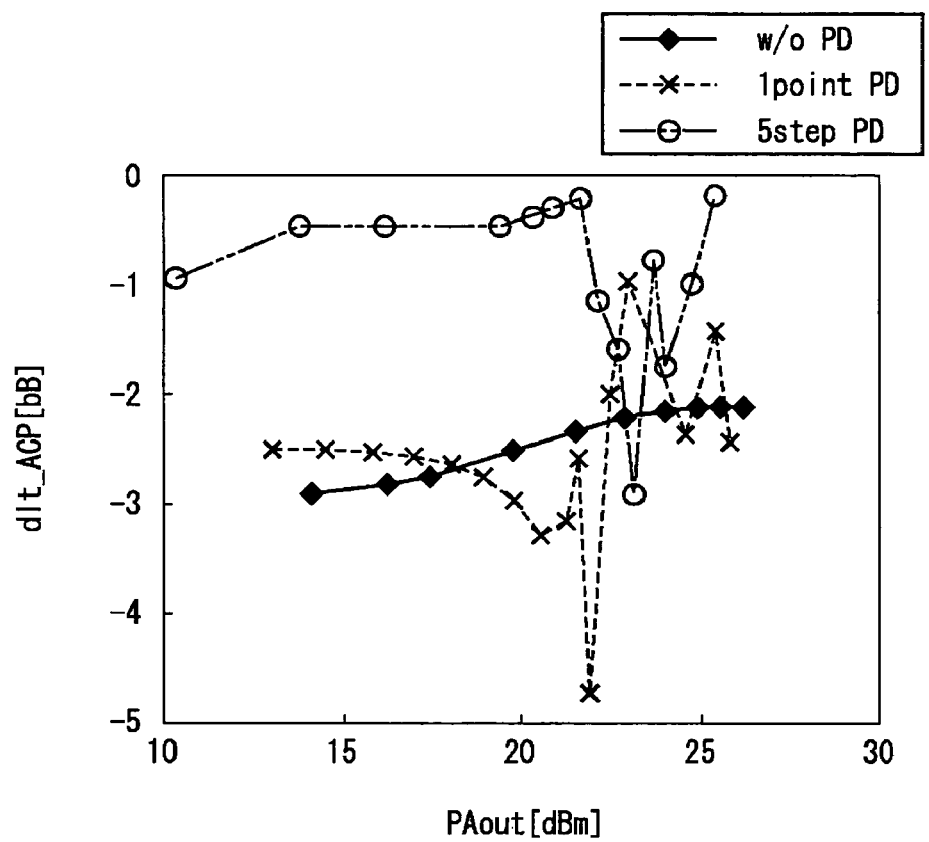
FIG. 14 is a graphical drawing illustrating output power dependencies of deviation within the band.
Figure 15:
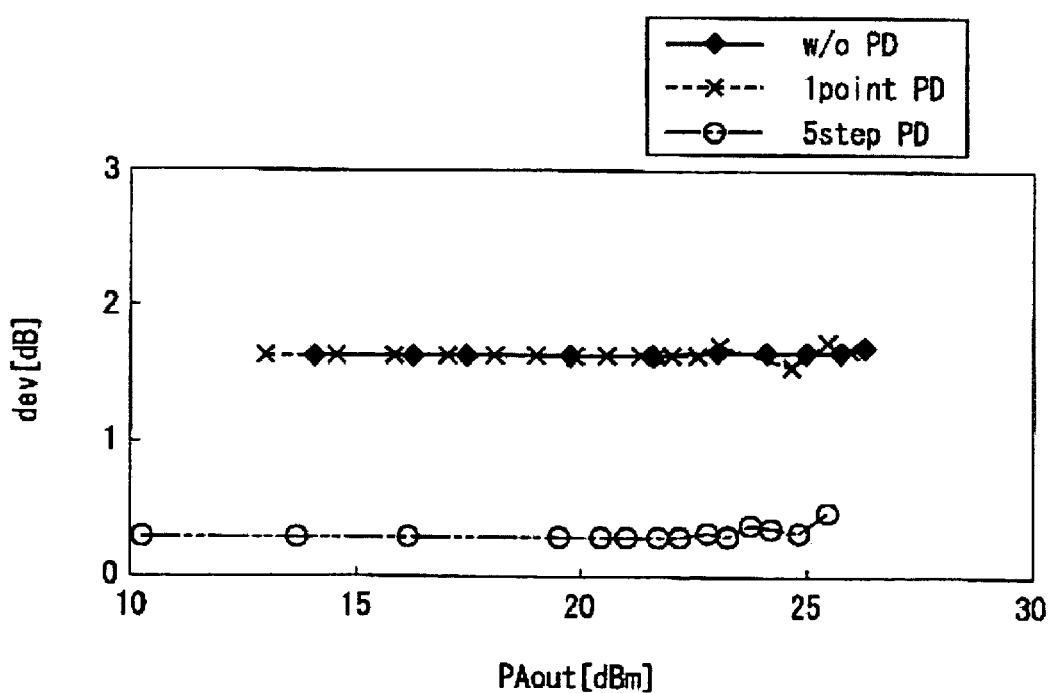
FIG. 15 is a graphical drawing illustrating output power dependencies of asymmetry in ACP.

FIGS. 14 and 15 show deviation within band dev and asymmetry in ACP, respectively. FIG. 14 shows an output dependency of deviation within band dev. In both examples of "1 point PD" and "w/o PD", there are some remaining deviations within band, and thus there is not improvement. On the other hand, in the preferred example of predistortion "5 step PD" according to the present invention, there is an effect because the deviation within band dev is suppressed within 1 dB up to about 22 dBm. Here, at the range of more than 23 dBm, the deviation within band dev becomes large, but this is caused by clipping. FIG. 15 shows the output power dependency of asymmetry of ACP. The asymmetry of ACP dlt_acpr is defined as dlt_acpr=ACP_high—ACP_low. In FIG. 15, the asymmetry of ACP dlt_acpr of the example "1 point PD" is approximately the same as that of the example of "w/o PD", and thus there is no improvement. On the other hand, the asymmetry of ACP dlt_acpr of the preferred example of "5 step PD" according to the present invention is within 0.5 dB, and thus there is an extremely high improvement.

As described above, the distortion compensation circuit according to the present invention once modulates the baseband to obtain low frequency signals. After this, the distortion compensation circuit accumulates past signal sequence over a plurality of sampling points, and results of multiplication of impulse response of the power amplifier is used for distortion compensation, so that distortion in a power amplifier with a high memory effect can be compensated in distortion over the entire bandwidth accurately.

The above-mentioned description is only for examples according to the present invention. Therefore, the present invention is not limited to the above-described embodiment and thus it is to be understood that changes and variations may be made according to circumstances without departing from the spirit or scope of the present invention.

What is claimed is:

1. A distortion compensation circuit for generating a predistortion signal to perform distortion compensation of a power amplifier comprising:

A/D converter means for digitizing a voltage value of a signal after quadrature modulating a baseband signal;

subtractor means supplied with the output data of the A/D converter means;

voltage value data output means for outputting a voltage value data corresponding to the output data of the subtractor means by selecting from a plurality of pieces of previously stored voltage value data;

amplitude impulse response accumulation adding means for outputting an accumulation adding value of multiplication values obtained by multiplying the signal voltage value after quadrature modulation by impulse response values corresponding to amplitude characteristic of the power amplifier in accordance with the voltage value data from the signal voltage value data outputting means and supplying to the subtractor means; and D/A converter means for converting the voltage value data from the voltage value data outputting means into an analog signal as an output predistortion signal regarding the amplitude component of the power amplifier, wherein said amplitude impulse response accumulation adding means comprises:

N of first table blocks each having a first table storing M of said multiplication values corresponding to each of said voltage value data and a first adder for adding M of said multiplication values outputted from said first table;

a delay block formed by serially connecting N−1 of delays for delaying the voltage value data outputted from said voltage value data output means by a predetermined time; and a second adder for outputting said accumulation adding values obtained by adding respective output values from respective first adder in said N of first table blocks to said subtractor means, and N of points comprising input point of said delay at a first stage, each of connecting points among delays, and output point of said delay at final stage in the delay block are connected to each of input point in said N of first table block, and at least a part of the voltage value data outputted from said voltage value data output means is defined as address data for accessing each of said first table in said first table block, wherein said M and N are natural numbers.

2. The distortion compensation circuit as cited in claim 1, further comprising:

phase impulse response accumulation adding means for outputting accumulation adding values of converted values obtained by changing code of the impulse response values depending on the voltage value after quadrature modulation and a phase characteristic of said power amplifier in response to the voltage value data from said voltage value data output means; and phase shift means for phase-shifting a phase of the predistortion signal regarding the amplitude component supplied to the power amplifier based on the accumulation adding values from said phase impulse response accumulation adding means.

3. The distortion compensation circuit as cited in claim 1, wherein said amplitude impulse response accumulation adding means comprises: N of second table blocks each having a second table storing M of said multiplication values corresponding to each of said voltage value data and a second adder for adding M of said multiplication values outputted from said second table; a second adder for outputting said accumulation adding values obtained by adding respective output values from respective second adder in said N of second table blocks to said subtractor means, and N of points comprising input point of said delay at a first stage, each of connecting points among delays, and output point of said delay at final stage in the delay block are connected to each of input point in said N of second table block, wherein said M and N are natural numbers.

4. The distortion compensation circuit as cited in claim 1, wherein said amplitude impulse response accumulation adding means comprises:

N of second table blocks each having a second table storing M of said multiplication values corresponding to each of said voltage value data and a second adder for adding M of said multiplication values outputted from said second table; a second adder for outputting said accumulation adding values obtained by adding respective output values from respective second adder in said N of second table blocks to said subtractor means, and N of points comprising input point of said delay at a first stage, each of connecting points among delays, and output point of said delay at final stage in the delay block are connected to each of input point in said N of second table block, wherein said M and N are natural numbers.

5. A distortion compensation circuit for generating a predistortion signal to perform distortion compensation of a power amplifier comprising:
A/D converter means for digitizing a voltage value of a signal after quadrature modulating a baseband signal;
subtractor means supplied with the output data of the A/D converter means;
voltage value data output means for outputting a voltage value data corresponding to the output data of the subtractor means by selecting from a plurality of pieces of previously stored voltage value data;
amplitude impulse response accumulation adding means for outputting an accumulation adding value of multiplication values obtained by multiplying the signal voltage value after quadrature modulation by impulse response values corresponding to amplitude characteristic of the power amplifier in accordance with the voltage value data from the signal voltage value data outputting means and supplying to the subtractor means;
D/A converter means for converting the voltage value data from the voltage value data outputting means into an analog signal as an output predistortion signal regarding the amplitude component of the power amplifier;
phase impulse response accumulation adding means for outputting accumulation adding values of converted values obtained by changing code of the impulse response values depending on the voltage value after quadrature modulation and a phase characteristic of said power amplifier in response to the voltage value data from said voltage value data output means; and
phase shift means for phase-shifting a phase of the predistortion signal regarding the amplitude component supplied to the power amplifier based on the accumulation adding values from said phase impulse response accumulation adding means,
wherein said amplitude impulse response accumulation adding means comprises:
N of first table blocks each having a first table storing M of said multiplication values corresponding to each of said voltage value data and a first adder for adding M of said multiplication values outputted from said first table;
a delay block formed by serially connecting N−1 of delays for delaying the voltage value data outputted from said voltage value data output means by a predetermined time; and
a second adder for outputting said accumulation adding values obtained by adding respective output values from respective first adder in said N of first table blocks to said subtractor means, and N of points comprising input point of said delay at a first stage, each of connecting points among delays, and output point of said delay at final stage in the delay block are connected to each of input point in said N of first table block, and at least a part of the voltage value data outputted from said voltage value data output means is defined as address data for accessing each of said first table in said first table block, wherein said M and N are natural numbers.

6. A transmission apparatus for transmitting a signal which is amplified by a power amplifier comprising:
a quadrature modulation section for quadrature-modulating a baseband signal;
a distortion compensation section including:
A/D converter means for digitizing a voltage value of a signal from said quadrature modulation section;
subtractor means supplied with the output data of the A/D converter means;
voltage value data output means for outputting a voltage value data corresponding to the output data of the subtractor means by selecting from a plurality of pieces of previously stored voltage value data;
amplitude impulse response accumulation adding means for outputting an accumulation adding value of multiplication values obtained by multiplying the signal voltage value after quadrature modulation by impulse response values corresponding to amplitude characteristic of the power amplifier in accordance with the voltage value data from the signal voltage value data outputting means and supplying to the subtractor means; and
D/A converter means for converting the voltage value data from the voltage value data outputting means into an analog signal as an output predistortion signal regarding the amplitude component of the power amplifier; and a conversion/removing section supplied with the output signal from the distortion compensation section for effecting frequency conversion and removal of electromagnetic interference and for transmitting to the power amplifier,
wherein said amplitude impulse response accumulation adding means comprises:
N of first table blocks each having a first table storing M of said multiplication values corresponding to each of said voltage value data and a first adder for adding M of said multiplication values outputted from said first table;
a delay block formed by serially connecting N−1 of delays for delaying the voltage value data outputted from said voltage value data output means by a predetermined time; and
a second adder for outputting said accumulation adding values obtained by adding respective output values from respective first adder in said N of first table blocks to said subtractor means, and N of points comprising input point of said delay at a first stage, each of connecting points among delays, and output point of said delay at final stage in the delay block are connected to each of input point in said N of first table block, and at least a part of the voltage value data outputted from said voltage value data output means is defined as address data for accessing each of said first table in said first table block, wherein said M and N are natural numbers.

* * * * *